United States Patent
Wu et al.

(10) Patent No.: US 7,884,462 B2
(45) Date of Patent: Feb. 8, 2011

(54) INSULATION COVERING STRUCTURE FOR A SEMICONDUCTOR ELEMENT WITH A SINGLE DIE DIMENSION AND A MANUFACTURING METHOD THEREOF

(75) Inventors: Liang-Chieh Wu, Tucheng (TW); Hui-Ming Feng, Jhongli (TW)

(73) Assignee: Inpaq Technology Co., Ltd., Hsinchu (TW)

( * ) Notice: Subject to any disclaimer, the term of this patent is extended or adjusted under 35 U.S.C. 154(b) by 99 days.

(21) Appl. No.: 12/241,492

(22) Filed: Sep. 30, 2008

(65) Prior Publication Data

US 2010/0078798 A1    Apr. 1, 2010

(51) Int. Cl.
- H01L 23/48 (2006.01)
- H01L 23/52 (2006.01)
- H01L 23/053 (2006.01)
- H01L 23/12 (2006.01)
- H01L 29/40 (2006.01)

(52) U.S. Cl. .................. 257/690; 257/750; 257/758; 257/700

(58) Field of Classification Search .............. 257/690, 257/750, 752, 753, 758, 760, 663, 671, 700, 257/702, 701, 761, 787, 788, 632, 687, 688
See application file for complete search history.

(56) References Cited

U.S. PATENT DOCUMENTS 5,969,426 A * 10/1999 Baba et al. .................. 257/778
2007/0164409 A1 * 7/2007 Holland ...................... 257/678

FOREIGN PATENT DOCUMENTS

TW    I249208    2/2006

* cited by examiner

*Primary Examiner*—Chuong A. Luu
(74) *Attorney, Agent, or Firm*—C. G. Mersereau; Nikolai & Mersereau, P.A.

(57) ABSTRACT

An insulation covering structure for a semiconductor element with a single die dimension includes: a semiconductor element with a single die dimension and an insulation covering layer. The semiconductor element has a front side surface, a rear side surface, a left side surface, a right side surface, a bottom surface, and a top surface. The top surface of the semiconductor element has two metal pads. The insulation covering layer covers the front side surface, the rear side surface, the left side surface, the right side surface, and the bottom surface of the semiconductor element. A manufacturing process for covering the semiconductor element with a single die dimension is also disclosed.

8 Claims, 4 Drawing Sheets

100a

INSULATION COVERING STRUCTURE FOR A SEMICONDUCTOR ELEMENT WITH A SINGLE DIE DIMENSION AND A MANUFACTURING METHOD THEREOF

BACKGROUND OF THE INVENTION

1. Field of the Invention

The present invention relates to an insulation covering structure for a semiconductor element and a manufacturing method thereof. In particular, the present invention relates to an insulation covering structure for the semiconductor element with a single die dimension and a manufacturing method thereof.

2. Description of Related Art

The semiconductor package process is for packaging the integrated circuit so as to provide a variety of functions, such as protection, cooling, and conducting, etc. Except for the high level packaging technologies, such as ball grid array (BGA), flip chip (FC), and multi chip module (MCM), the general packaging way is the wire-bonding package whose process comprises die bonding, wire bonding, molding, and marking, etc.

Taiwan patent, TW I249208, discloses a wafer level packaging process and a packaging structure for a wafer level die dimension. A wafer is provided. The wafer has a first surface and a second surface and at least one cutting channel that are opposite to the first surface. A plurality of blind holes is formed on the first surface of the wafer. The wafer has a plurality of pads, and each of the blind holes corresponds to one of the pads. A plurality of conducting column is formed in the blind holes. One end of the conducting column is electrically connected with the pad. A plurality of glue frames is disposed on the first surface of the wafer. A substrate is located on the glue frame. There is a gap between the substrate and the wafer. The wafer is grinded to expose another rend of the conducting column. A plurality of solder balls is formed on the first pads. On the second surface of the wafer, there is a re-matched circuit layer. There is a plurality of solder balls on the re-matched circuit layer, and the solder balls are electrically connected with the first pads via the re-matched circuit layer.

However, the above package structure is implemented by the wire-bonding package whose process includes die bonding, wire bonding, molding, and marking, etc, thereby the manufacturing process is complex and time-consuming so that the cost increases.

SUMMARY OF THE INVENTION

One particular aspect of the present invention is to provide an insulation covering structure for a semiconductor element with a single die dimension and a manufacturing method thereof, which can simplify the manufacturing process and reduce the cost.

The insulation covering structure for the semiconductor element with a single die dimension includes: a semiconductor element with a single die dimension and an insulation covering layer. The semiconductor element has a front side surface, a rear side surface, a left side surface, a right side surface, a bottom surface, and a top surface. The top surface of the semiconductor element has two metal pads. The insulation covering layer covers the front side surface, the rear side surface, the left side surface, the right side surface, and the bottom surface of the semiconductor element.

The present invention also provides a manufacturing process for covering the semiconductor element with a single die dimension, and includes the following steps. A semiconductor element with a single die dimension and a jig are provided. The top surface of the semiconductor element is pasted onto the jig. Next, a covering manufacturing process is performed to place the jig and the semiconductor element on a film-plating equipment so as to form an insulation covering layer on the semiconductor element. The jig is used to shelter the top surface of the semiconductor element, where a metal wire area is defined, from the insulation covering layer. Two metal pads are formed on the metal wire area. Next, the jig and the semiconductor element are taken off from the film-plating equipment, and, the jig and the semiconductor element are separated. A conducting layer is formed at the two ends of the semiconductor element, and covers the insulation covering layer and the two metal pads. An electroplating layer is formed at the two ends of the semiconductor element, and wraps the conducting layer.

The present invention has the following characteristics.

1. By utilizing the manufacturing process, the semiconductor element with small size can be packaged with the same reliability as the wire-bonding package whose process includes die bonding, wire bonding, and molding, etc, but with reduced cost. The dimension of a single die can be 0.4 mm×0.2 mm×0.2 mm, 1.0 mm×0.5 mm×0.5 mm, 0.5 mm×0.25 mm×0.25 mm, or 1.6 mm×0.8 mm×0.5 mm. The semiconductor element with a single die dimension is protected, and is not affected by environment, such as moist, dust, or other particles.

2. By using the jig and design for the passive elements, the manufacturing process for the semiconductor element package is simplified. Furthermore, the electrode terminals and the electroplating layer with a welding interface commonly adopted by the passive elements are formed on the semiconductor element with a single die dimension for electrically connecting with other substrate. The cost for precise package equipment is reduced, and the manufacturing process is simplified.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF PREFERRED EMBODIMENTS

Figure 1:
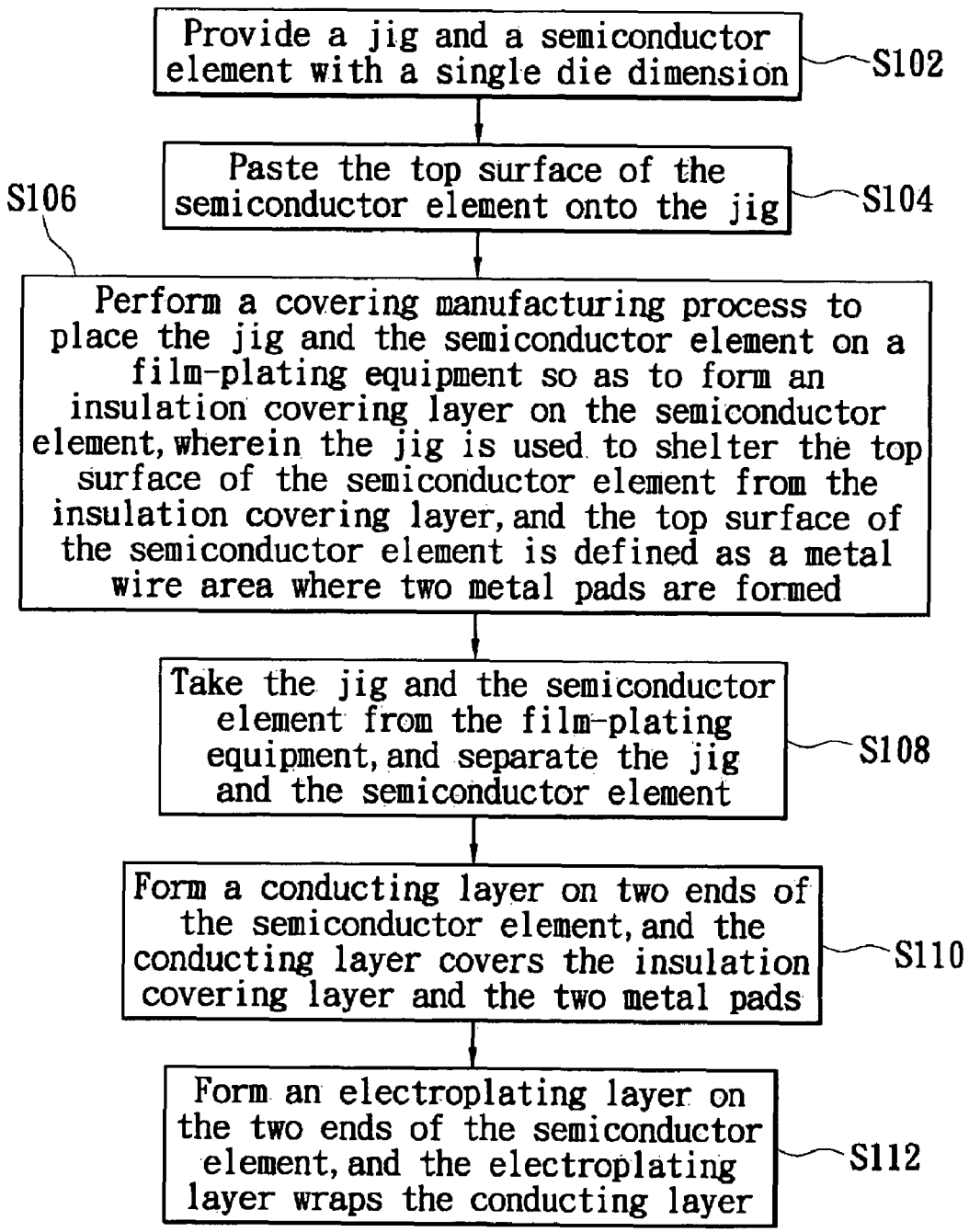
FIG. 1 is a flow chart of the manufacturing process for insulation covering the semiconductor element with a single die dimension of one embodiment of the present invention.

Reference is made to FIG. 1. The manufacturing process for covering the semiconductor element with a single die dimension includes the following steps, step S102, step S104, step S106, step S108, step S110, and step S112.

Figure 2:
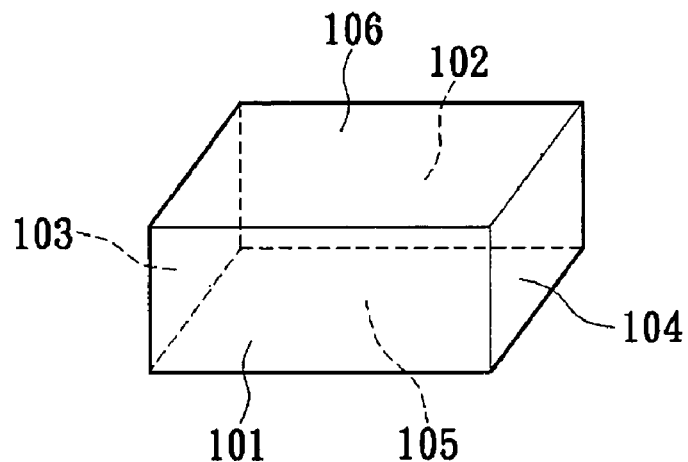
FIG. 2 is a perspective view of the insulation covering structure for the semiconductor element with a single die dimension of one embodiment of the present invention.

Step S102:

Reference is made to FIG. 2 in conjunction with FIG. 1. Firstly, a semiconductor element with a single die dimension 100 is provided. The semiconductor element with a single die dimension 100 is a cubic. The cubic is composed of six surfaces, including a front side surface 101, a rear side surface 102, a left side surface 103, a right side surface 104, a bottom surface 105, and a top surface 106. The dimension of the cubic is 0.4 mm×0.2 mm×0.2 mm, 0.6 mm×0.3 mm×0.5 mm, 1.0 mm×0.5 mm×0.5 mm, or 1.6 mm×0.8 mm×0.5 mm.

Figure 3:
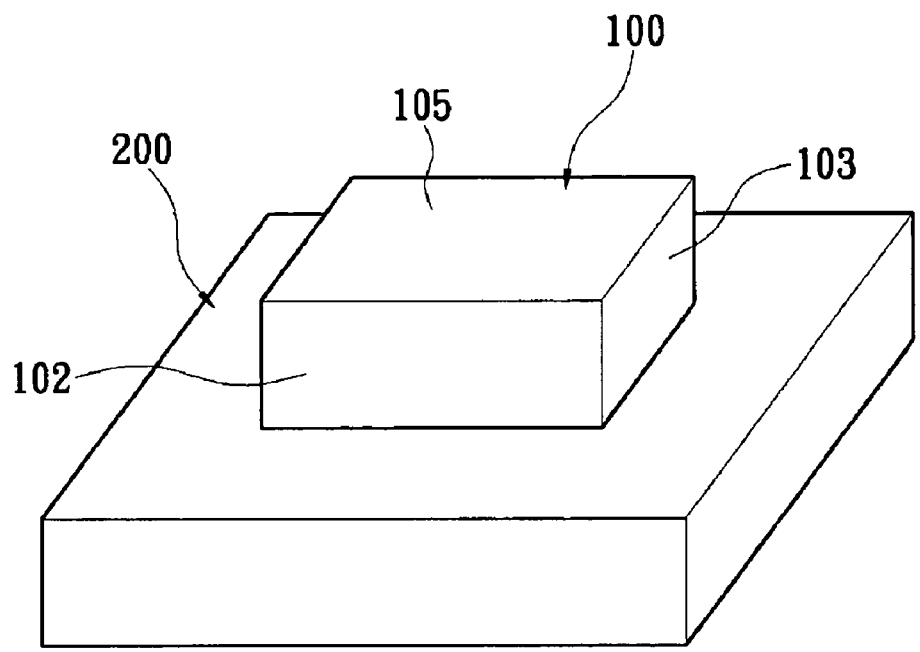
FIG. 3 is a perspective view of the insulation covering structure for the semiconductor element with a single die dimension located on a jig of one embodiment of the present invention.

Reference is made to FIG. 3. A jig 200 is provided. The jig 200 is designed by the user.

Step 104:

The semiconductor element with a single die dimension 100 is placed onto the jig 200 so as to make the top surface 106 of the semiconductor element with a single die dimension 100 to be pasted onto the jig 200.

Figure 4:
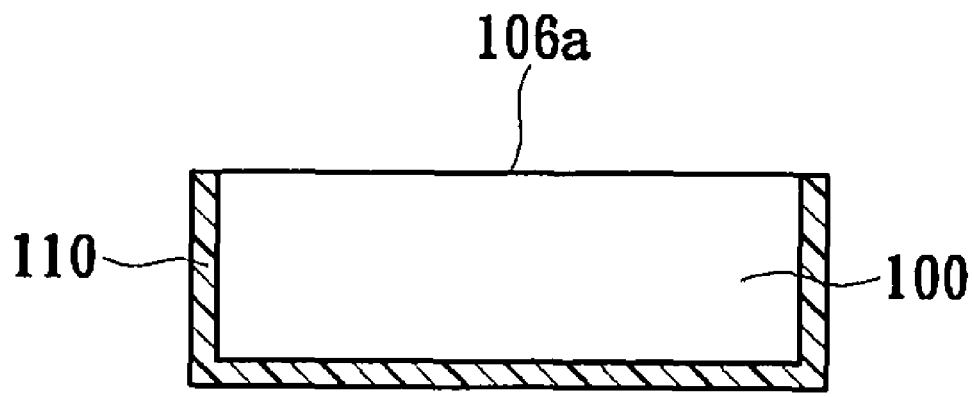
FIG. 4 is a first schematic diagram of the cross-section for showing the manufacturing process of the present invention.

Step 106:

Next, a covering manufacturing process is performed to place the jig 200 and the semiconductor element with a single die dimension 100 on a film-plating equipment (not shown in the figure). Reference is made to FIG. 4. An insulation covering layer 110 is formed on the semiconductor element with a single die dimension 100. The insulation covering layer 110 can be made of macromolecule coating material, silicon oxidize, or polycrystalline silicon. The insulation covering layer 110 covers the front side surface 101, the rear side surface 102, the left side surface 103, the right side surface 104, and the bottom surface 105 of the semiconductor element with a single die dimension 100. The thickness of the insulation covering layer 110 is between 1 Å and 100 µm for protecting the semiconductor element with a single die dimension 100.

Figure 5:
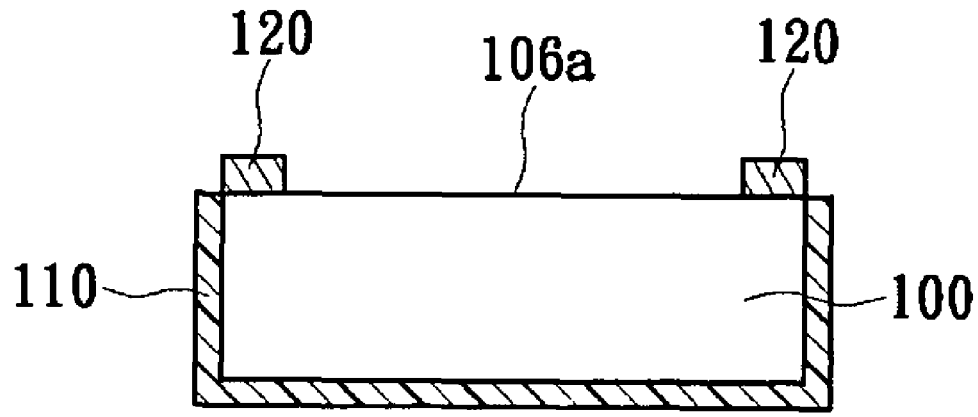
FIG. 5 is a second schematic diagram of the cross-section for showing the manufacturing process of the present invention.

By using the jig 200, the top surface 106 of the semiconductor element with a single die dimension 100, where a metal wire area 106a is defined and formed on the top surface 106 of the semiconductor element with a single die dimension 100, is sheltered from the insulation covering layer. Reference is made to FIG. 5. Before the metal wire area 106a underwent the covering manufacturing process, the metal wire area 106a already has two metal pads 120. The two metal pads 120 are used for electrically connecting with other substrates. The method for forming the two metal pads 120 is a common semiconductor manufacturing process, such as lithography and metal etching, therefore is not illustrated.

Step S108:

Next, the jig 200 and the semiconductor element with a single die dimension 100 are taken off from the film-plating equipment, and the jig 200 and the semiconductor element with a single die dimension 100 are separated.

Figure 6:
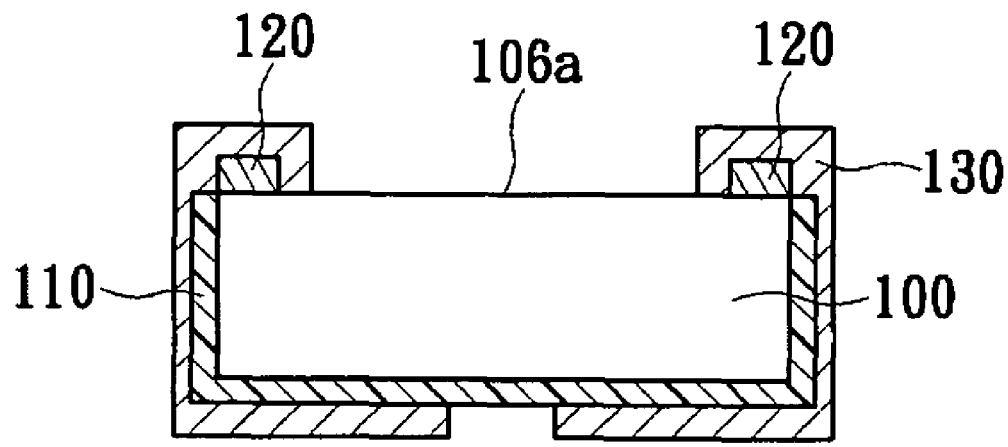
FIG. 6 is a third schematic diagram of the cross-section for showing the manufacturing process of the present invention.

Step S110:

Reference is made to FIG. 6. Two ends of the semiconductor element with a single die dimension 100 are attached with silver epoxy and are processed by a drying process, a curing process, or a firing process so as to form a conducting layer. In this embodiment, the conducting layer is also called as an electrode terminal 130, furthermore the electrode terminal 130 at least comprises of silver or at least comprises of copper. The electrode terminal 130 covers the insulation covering layer 110 and the two metal pads 120.

Figure 7:
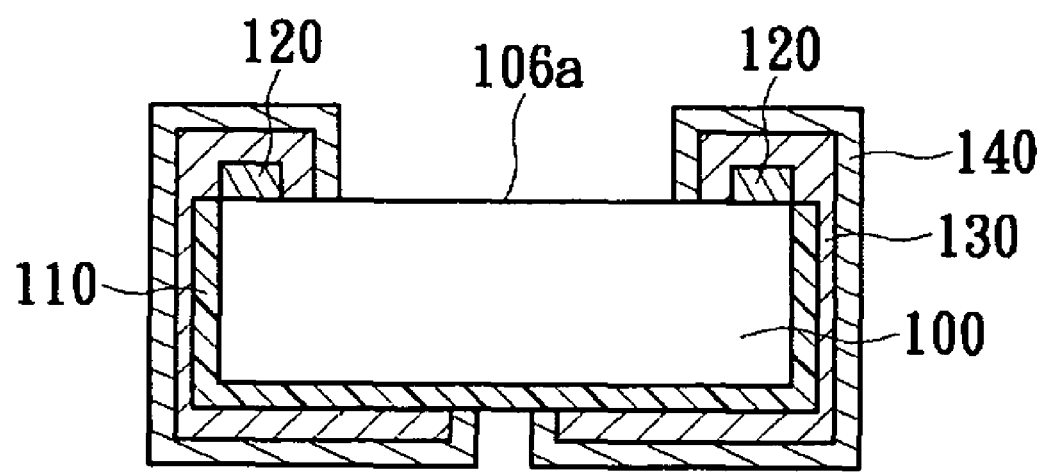
FIG. 7 is a fourth schematic diagram of the cross-section for showing the manufacturing process of the present invention.

Step S112:

Reference is made to FIG. 7. The two ends of the semiconductor element with a single die dimension 100 are electroplated to form an electroplating layer 140. The electroplating layer 140 includes nickel and tin. The electroplating layer 140 wraps the electrode terminal 130 to form electrode terminal adopted by the semiconductor element with a single die dimension 100 to electrically connect with other substrates.

The present invention has the following characteristics:

1. Because the present invention does not use the wire-bonding package (die bonding, wire bonding, molding, and marking, etc) and uses the manufacturing process for the passive elements, the semiconductor element with small dimension size can be packaged with lower cost and has the same reliability compared to wire-bonding package. The dimension of a single die can be 0.4 mm×0.2 mm×0.2 mm, 1.0 mm×0.5 mm×0.5 mm, 0.5 mm×0.25 mm×0.25 mm, or 1.6 mm×0.8 mm×0.5 mm. The present invention uses the insulation covering layer 110, the electrode terminal 130 and the electroplating layer 140 to prevent the semiconductor element with a single die dimension 100 from being affected by environment, such as moist, dust, or other particles, and to electrically connect with other substrates.

2. By using the jig 200 and the design, the manufacturing process for the semiconductor element package is simplified. Furthermore, the electrode terminal 130 and the electroplating layer 140 with a welding interface adopted by the passive elements are formed on the semiconductor element with a single die dimension for electrically connecting with other substrates. It does not use the wire-bonding package (die bond, wired bond, molding, and marking) to electrically connect with other substrates. The cost for precise package equipment is reduced, and the manufacturing process is simplified.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An insulation covering structure for a semiconductor element with a single die dimension, comprising:

a semiconductor element with a single die dimension, wherein the semiconductor element with a single die dimension has a front side surface, a rear side surface, a left side surface, a right side surface, a bottom surface, and a top surface, and the top surface of the semiconductor element with a single die dimension has two metal pads;

an insulation covering layer, wherein the insulation covering layer covers the front side surface, the rear side surface, the left side surface, the right side surface, and the bottom surface of the semiconductor element with a single die dimension;

two electrode terminals, respectively formed on two ends of the semiconductor element, wherein the two electrode terminals respectively cover the insulation covering layer on the left side surface and the right side surface, and wherein the two electrode terminals extend onto the top surface and the bottom surface having a gap; and two electroplating layers, respectively surrounding the two electrode terminals.

2. The insulation covering structure for the semiconductor element with a single die dimension as claimed in claim 1, wherein the insulation covering layer comprises at least one macromolecule material.

3. The insulation covering structure for the semiconductor element with a single die dimension as claimed in claim 1, wherein the electrode terminals respectively cover the metal pads.

4. The insulation covering structure for the semiconductor element with a single die dimension as claimed in claim 3, wherein the electrode terminal at least comprises silver.

5. The insulation covering structure for the semiconductor element with a single die dimension as claimed in claim 3, wherein the electrode terminal at least comprises copper.

6. The insulation covering structure for the semiconductor element with a single die dimension as claimed in claim 3, wherein the electroplating layer wraps the electrode terminal.

7. The insulation covering structure for the semiconductor element with a single die dimension as claimed in claim 6, wherein the electroplating layer comprises nickel.

8. The insulation covering structure for the semiconductor element with a single die dimension as claimed in claim 6, wherein the electroplating layer comprises tin.

* * * * *